(12) United States Patent
Yasuda et al.

(10) Patent No.: US 7,564,531 B2
(45) Date of Patent: Jul. 21, 2009

(54) LCD DEVICE AND METHOD INCLUDING A PLASTIC SUBSTRATE WITH METAL LAYER CONTAINING COPPER SURROUNDED BY BARRIER METAL FILM EMBEDDED IN A GROOVE WITHIN THE PLASTIC SUBSTRATE

(75) Inventors: Kyounei Yasuda, Kanagawa (JP); Seiji Suzuki, Kanagawa (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 461 days.

(21) Appl. No.: 11/375,112

(22) Filed: Mar. 15, 2006

(65) Prior Publication Data
US 2006/0209222 A1    Sep. 21, 2006

(30) Foreign Application Priority Data
Mar. 15, 2005    (JP) .............................. 2005-073631

(51) Int. Cl.
*G02F 1/1345* (2006.01)
(52) U.S. Cl. ...................................... 349/147; 349/148
(58) Field of Classification Search ................. 349/147, 349/148
See application file for complete search history.

(56) References Cited
U.S. PATENT DOCUMENTS 5,892,558 A * 4/1999 Ge et al. ........................ 349/43
6,008,877 A * 12/1999 Akiyama et al. ............. 349/147
6,480,253 B1 * 11/2002 Shigeta et al. ............... 349/148
6,515,726 B2   2/2003 Chae et al.

FOREIGN PATENT DOCUMENTS

JP    2002-202519    7/2002
JP    2003-243499    8/2003

OTHER PUBLICATIONS

Chinese Office Action dated Aug. 31, 2007, with English-language translation.

* cited by examiner

*Primary Examiner*—David Nelms
*Assistant Examiner*—John Heyman
(74) *Attorney, Agent, or Firm*—McGinn IP Law Group, PLLC

(57) ABSTRACT

An active matrix substrate or TFT substrate is provided with a lower layer wiring with a groove wiring structure covering surroundings of a copper layer with a barrier metal film is formed by forming a groove at an insulating substrate and depositing the barrier metal film and the copper layer in this groove. This groove wiring structure is used for a TFT substrate of a liquid crystal display (LCD) device. It is possible to manufacture an LCD device with large size, high density, a large aperture ratio and in which the disclination defects originating from a different in level of the lower layer wiring and an occurrence of disconnection failures in an upper layer wiring are suppressed.

17 Claims, 11 Drawing Sheets

LCD DEVICE AND METHOD INCLUDING A PLASTIC SUBSTRATE WITH METAL LAYER CONTAINING COPPER SURROUNDED BY BARRIER METAL FILM EMBEDDED IN A GROOVE WITHIN THE PLASTIC SUBSTRATE

BACKGROUND OF THE INVENTION

1. Field of the Invention

The present invention relates to a liquid crystal display (LCD) device and its manufacturing method. In particular, the present invention relates to a structure of a substrate for display device of the LCD device and its manufacturing method.

2. Description of the Prior Art

In recent years, an active-matrix type LCD device is widely used as a display with high resolution. Such LCD device has a liquid crystal sandwiched between an active matrix substrate as a first substrate and an opposite substrate as a second substrate. A typical example of the active matrix substrate is provided with switching elements such as thin film transistors (TFTs) at each of plurality of pixels and the opposite substrate is provided with color filters and a black matrix. In this LCD device, orientation directions of liquid crystal molecules are changed by an electric field between electrodes provided on the active matrix substrate or TFT substrate and the opposite substrate, respectively or between a plurality of electrodes provided on the TFT substrate and then an amount of light transmittance is controlled at each pixel.

A conventional structure of the TFT substrate will be described with reference to FIG. 1 and FIGS. 2A to 2C. A gate wiring 102 and a drain wiring 106 perpendicular to the gate wiring 102 via a gate insulating film 103 are formed on an insulating substrate 101 made of, for example, a glass substrate. A TFT is provided in a vicinity of a crossing portion between the gate wiring 102 and the drain wiring 106. As shown in FIG. 2A, the TFT is provided with a gate electrode 102A formed on the insulating substrate 101 and the gate insulating film 103 formed on the gate electrode 102A. A lamination film of an amorphous silicon film (described as an a-Si film 104) and an n+ type amorphous silicon film (described as an n+ a-Si film 105) is formed on the gate insulating film 103. A drain electrode 106A and a source electrode 107 both made of the same material as that of the drain wiring 106 are formed on the n+ a-Si film 105 to configure the TFT. A passivation film 108 formed of an SiN film or the like is formed so as to cover the TFT. Between the drain wiring 106 and a pixel electrode 110, a gate light-shielding film 102B is formed in the same layer as the gate wiring 102 as shown in FIG. 1. The gate light-shielding film 102B shields the light incident on the periphery of the pixel electrode 110. The source electrode 107 is connected to the pixel electrode 110 via a contact hole 109 on the TFT substrate of FIG. 1.

The larger the LCD device becomes the longer wirings such as the gate wiring and the drain wiring become and the resistance of overall wirings increases. As a result, signal delays occur and display qualities becomes prone to deterioration. Moreover, in order to respond to demands for much higher density and improvements in aperture ratio of the LCD device, it is necessary to form wirings narrower. However, when wirings become narrow, the resistance increases similarly to the case described before and the display qualities deteriorate due to the signal delays. Since aluminum (Al), which has hitherto been used as a material for the gate wirings, has an especially high resistance, it is impossible to obtain an LCD device with a high image quality due to a signal delay at the gate wiring. Accordingly, a method using copper (Cu) whose resistance is lower than that of Al as a material for the wirings in order to reduce the resistance of wirings is proposed in Japanese Patent Laid-open Official Gazette No. 2002-202519 and the like.

However, due to mutual reactions between Cu and oxide silicon (SiO2), silicon nitride (SiN), or the like in Si-containing films, film qualities tend to deteriorate when Cu is used as the material for wirings. Moreover, because of poor resistances to chemicals and corrosion, Cu is likely to be etched during manufacturing steps of the TFT substrate. Furthermore, there is a problem where Cu cannot be used as a single layer due to a drawback of Cu such as its poor adhesion to substrates.

In addition, the gate electrode 102A, the gate light-shielding film 102B, and the gate wiring 102 are formed on the insulating substrate 101 made of a glass substrate and so forth on the substrate for display of the conventional LCD device as shown in FIGS. 2A to 2C. For this reason, influences of step heights of wirings in a lower layer side appear on an upper layer side and in a liquid crystal layer. When a film thickness of the wirings is made larger in order to reduce the resistance of the wirings, the influence of difference in level of the wirings in the lower layer side will become obvious. As a result, there was a problem that disclination defects due to disorder of liquid crystal orientation and disconnection failures of an upper layer wiring tend to occur readily.

SUMMARY OF THE INVENTION

The present invention provides an LCD device, which solves problems associated with the TFT substrate as described above and are caused when a Cu material is used for the wirings and the disclination defects originating from the difference in level of wirings in the lower layer side, and its manufacturing method.

In the LCD device of the present invention, the substrate for display is provided with a first wiring in the lower layer side and a second wiring in the upper layer side both extending in a direction perpendicular to each other. A switching element in a vicinity of an intersection between the first and second wirings and a pixel electrode in each pixel region surrounded by the first and second wirings are provided on the TFT substrate of the present invention. The first wiring includes a Cu layer which is embedded in a groove formed on the insulating substrate in advance and a barrier metal film covering the surroundings of the Cu layer on the substrate for the LCD device of the present invention.

The LCD substrate of the present invention is further provided with a light-shielding film in the same layer as the first wiring and in a region including a part of an area between the second wiring and the pixel electrode. This light-shielding film is embedded in the groove formed on the insulating substrate in advance and includes the Cu layer and the barrier metal film covering the surroundings of the Cu layer like the first wiring.

According to the present invention, in the TFT substrate, the first wiring (or the first wiring and the light-shielding film) made from the Cu layer in the lower layer side is formed in the groove on a surface of the insulating substrate. The TFT substrate is made into a structure where the barrier metal film is covering the surroundings of the Cu layer. The mutual reactions between the Cu layer and Si in the insulating substrate made of a glass substrate or the like can be suppressed and resistances to chemicals and corrosion of the first wiring can be improved. Furthermore, adhesion of the first wiring to the insulating substrate can also be improved. Additionally, since the first wiring is embedded in the groove, occurrence of the disclination defects and disconnection failures of the second wiring in the upper layer side can be suppressed by reducing the side difference in level due to the presence of the first wiring Moreover, in the LCD device of the present invention, it is possible to lower the resistance of a lower layer wiring by using a groove wiring made of Cu metal for the lower layer wiring of the TFT substrate and to suppress signal delays in the lower layer wiring. In the present invention, by using the TFT substrate having such a lower layer wiring structure, it is possible to manufacture a LCD device with large size, high density, large aperture ratio and improved display qualities.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

Figure 1:
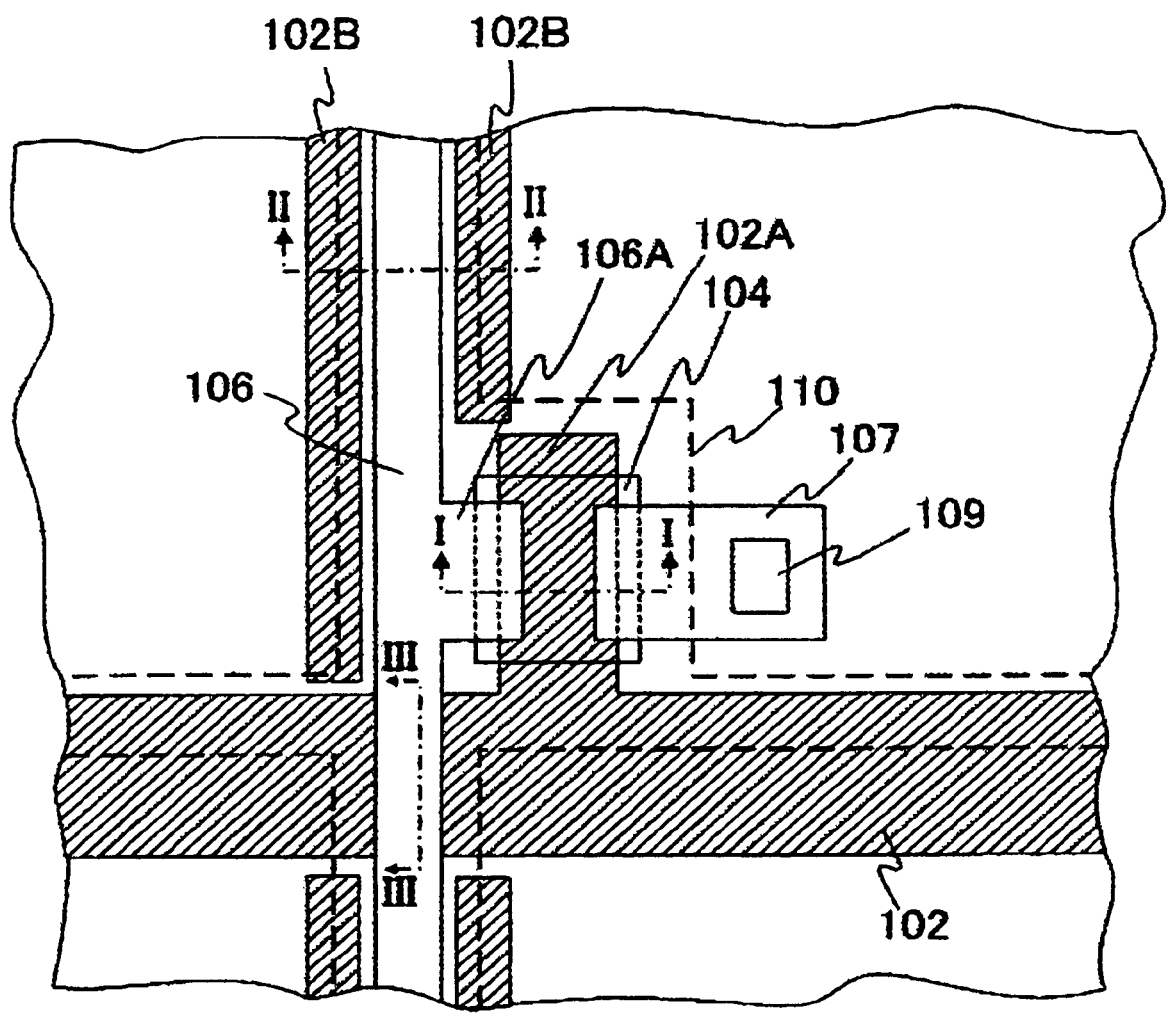
FIG. 1 is a plan view schematically showing a structure of a vicinity of an intersection between a gate wiring and a drain wiring of a TFT substrate according to a conventional LCD device.
Figure 2A:
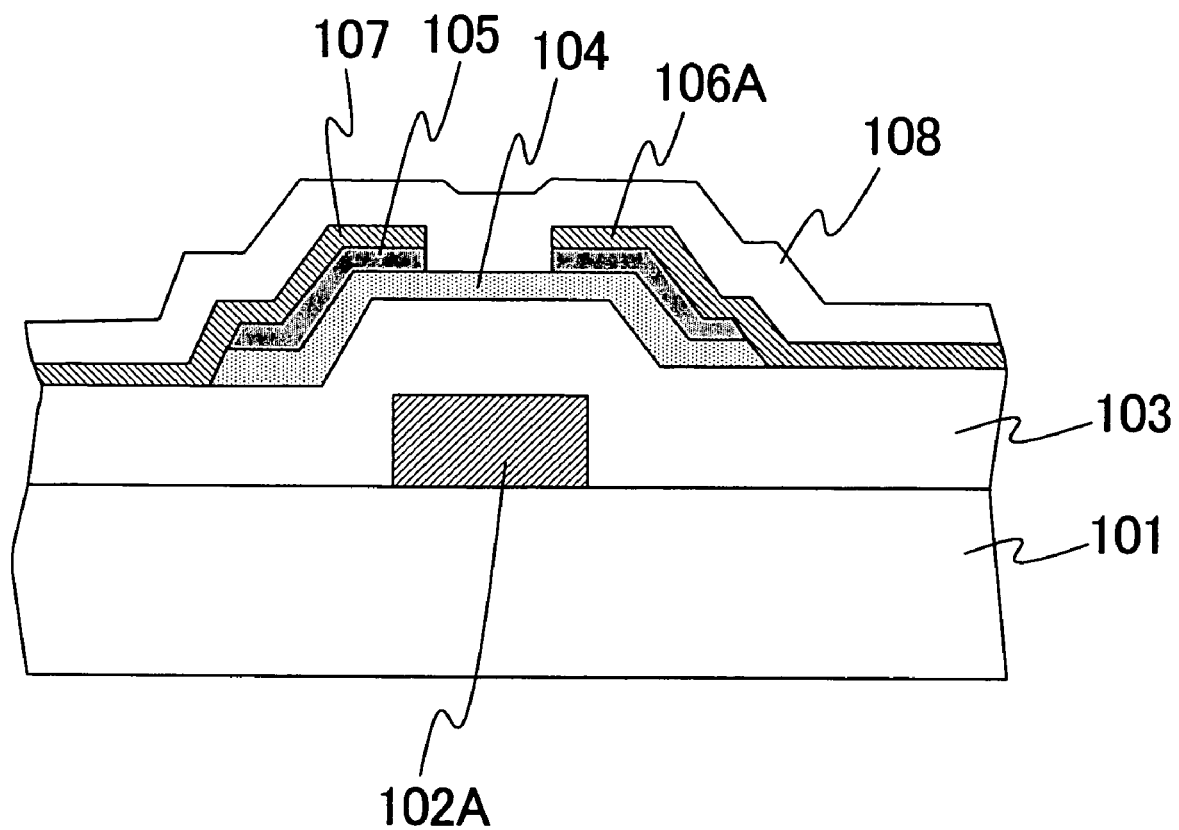
FIG. 2A is a cross-sectional view showing a TFT structure along the line I-I in FIG. 1.
Figure 2B:
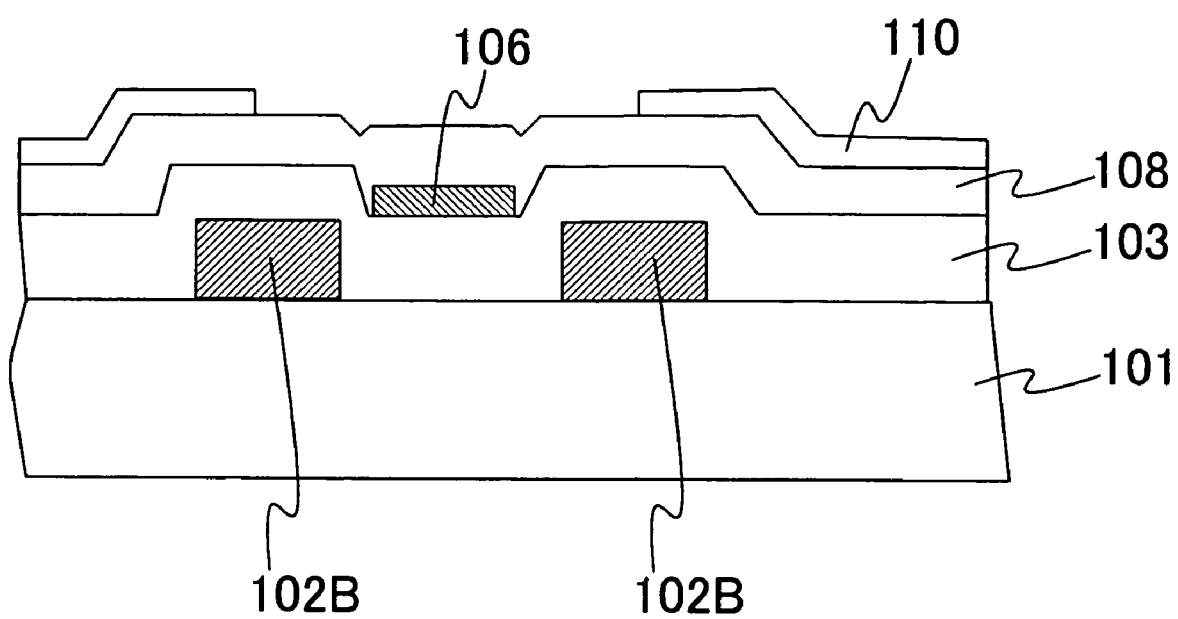
FIG. 2B is a cross-sectional view showing a structure of the drain wiring and its vicinity along the line II-II in FIG. 1.
Figure 2C:
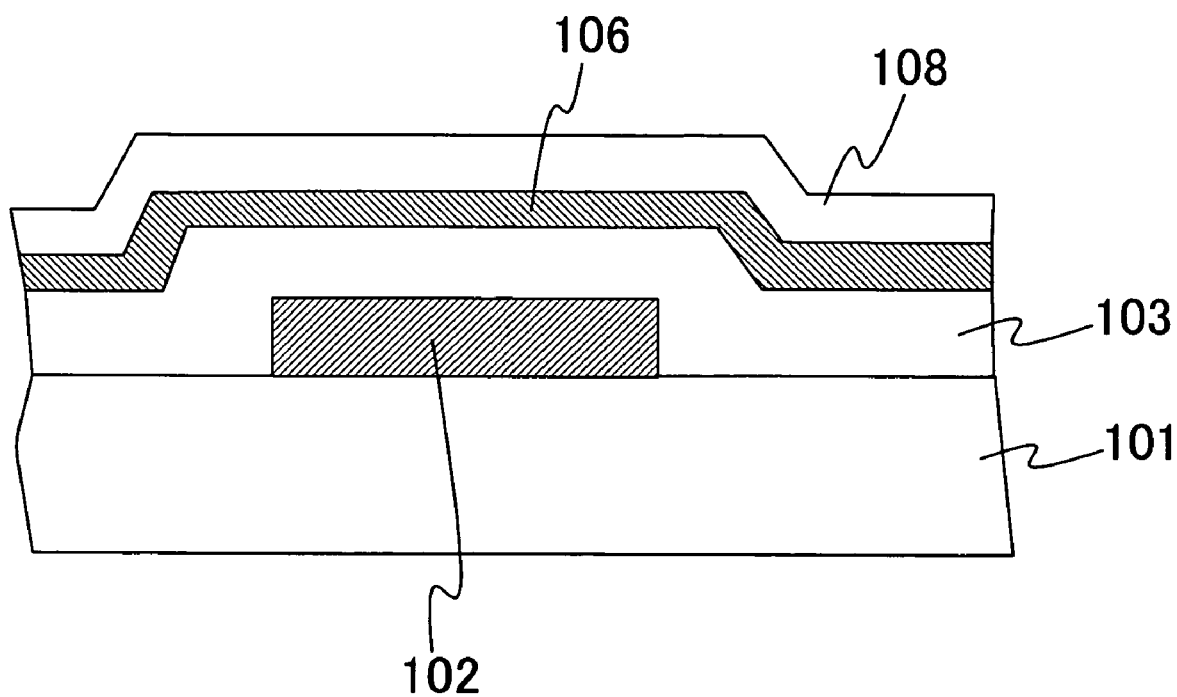
FIG. 2C is a cross-sectional view of a crossing portion between the gate wiring and the drain wiring.

Embodiments of the LCD device of the present invention will be described with reference to drawings. A structure of a TFT substrate as an example of a first substrate for display of the LCD device of the present invention is shown in FIG. 3 and FIGS. 4A to 4C. A gate wiring 2 is formed in a groove on the surface of the insulating substrate 1 made of a glass substrate or a plastic substrate. Incidentally, polycarbonates, polyether sulfones, polyarylates, or the like can be used for the plastic substrate. A drain wiring 6 is formed on the insulating substrate 1 in a manner to be perpendicular to the gate wiring 2. A TFT as a switching element is arranged in a vicinity of a crossing portion between the gate wiring 2 and the drain wiring 6. The TFT is provided with a gate electrode 2A formed in a groove 12 at the surface of the insulating substrate 1 and a gate insulating film 3 formed on the insulating substrate 1 including the gate electrode 2A as shown in FIG. 4A. The gate insulating film 3 is made of an SiN film or the like and formed into a thickness of approximately 300 nm to 500 nm by a Chemical Vapor Deposition (CVD) method or the like. The gate electrode 2A is formed as a branch wiring of the gate wiring 2. The gate electrode 2A is provided with a lower layer barrier metal film 13 formed on an inner wall of the groove 12 and a Cu layer 14 formed to fill the inside surrounded by the lower layer barrier metal film 13. An upper layer barrier metal film 15 further covers a top surface of the Cu layer 14. These barrier metal films are formed by depositing films of high-melting-point metals such as Cr, Mo, and Ti by a sputtering method. The barrier metal films are formed into a thickness of approximately 50 nm to 100 nm. A depth of the groove 12 is determined according to a necessary thickness of the Cu layer 14. The depth of the groove 12 is normally approximately 300 nm to 500 nm. The groove 12 can be formed by an etching method when the insulating substrate 1 is the glass substrate, and can be formed by a laser processing method or the like when the insulating substrate 1 is the plastic substrate. The Cu layer 14 is formed by an electroless plating or the sputtering method. Note that a structure of the gate electrode 2A is the same as that of the gate wiring 2 shown in FIG. 4C.

Figure 4A:
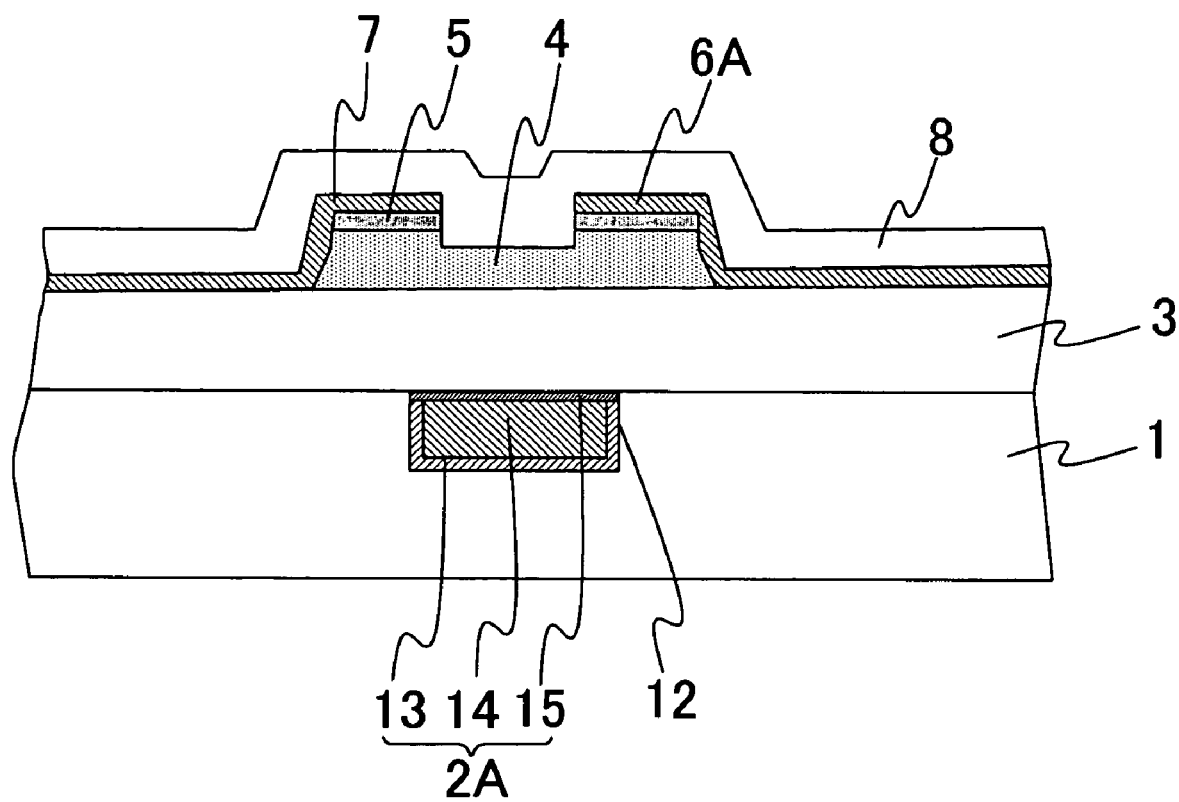
FIG. 4A is a cross-sectional view showing a TFT structure along the line I-I in FIG. 3.
Figure 4B:
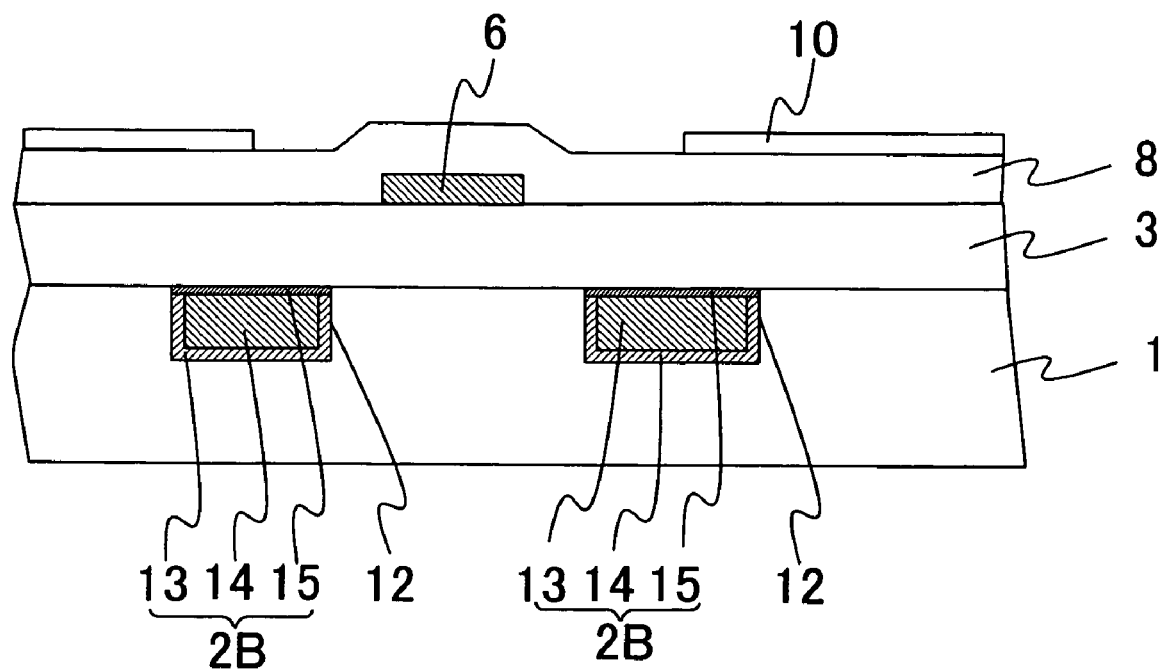
FIG. 4B is a cross-sectional view showing a structure of the drain wiring and its vicinity along the line II-II in FIG. 3.
Figure 4C:
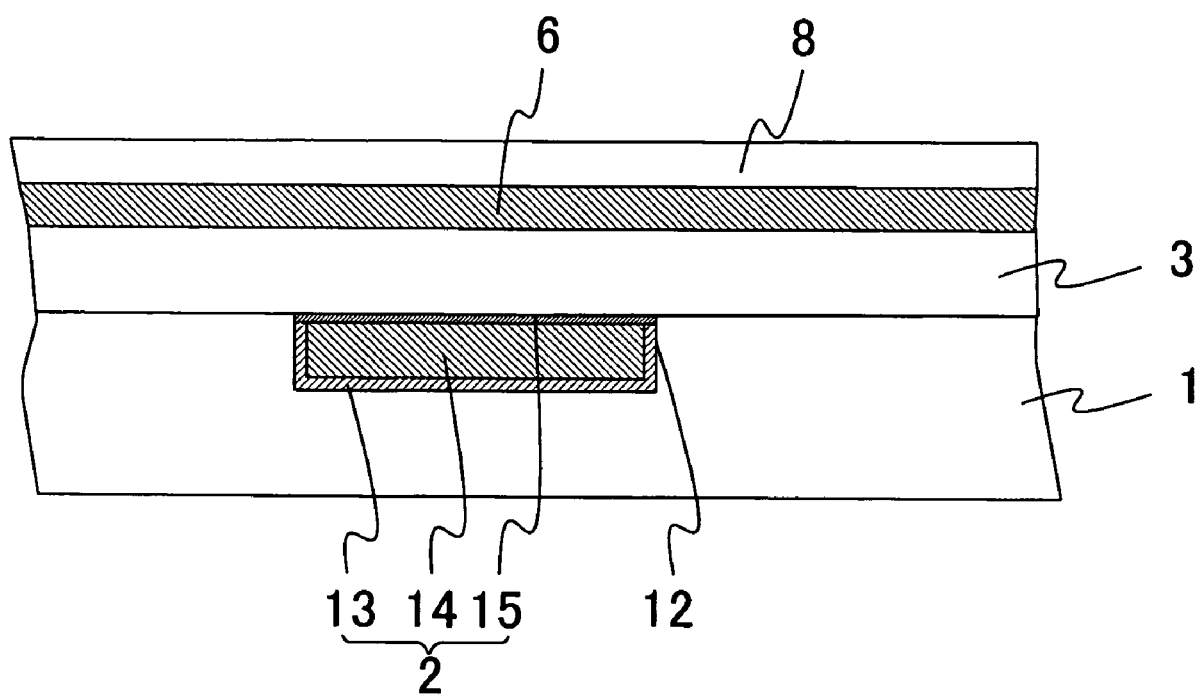
FIG. 4C is a cross-sectional view of a crossing portion between the gate wiring and the drain wiring along the line III-III in FIG. 3.

A semiconductor film, which is a lamination film of an a-Si film 4 and an n+ a-Si film 5, is formed in a shape of an island on the gate insulating film 3. A drain electrode 6A and a source electrode 7 are formed on the n+a-Si film 5 to configure the TFT. Note that polycrystalline silicon films can also be used for the semiconductor film. A metal film made from Mo or the like as a material for the drain wiring 6, drain electrode 6A, and source electrode 7 is formed into a thickness of approximately 200 nm by the sputtering method. A passivation film 8 is then formed to cover the TFT. The passivation film 8 is formed by forming, for example, the SiN film into a thickness of approximately 150 nm to 200 nm by the plasma CVD method. A pixel electrode 10 made of a transparent conductive film like an indium tin oxide (ITO) film is formed on the passivation film 8 as shown in FIG. 4B. The ITO film is formed into a thickness of approximately 50 nm by the sputtering method.

Figure 3:
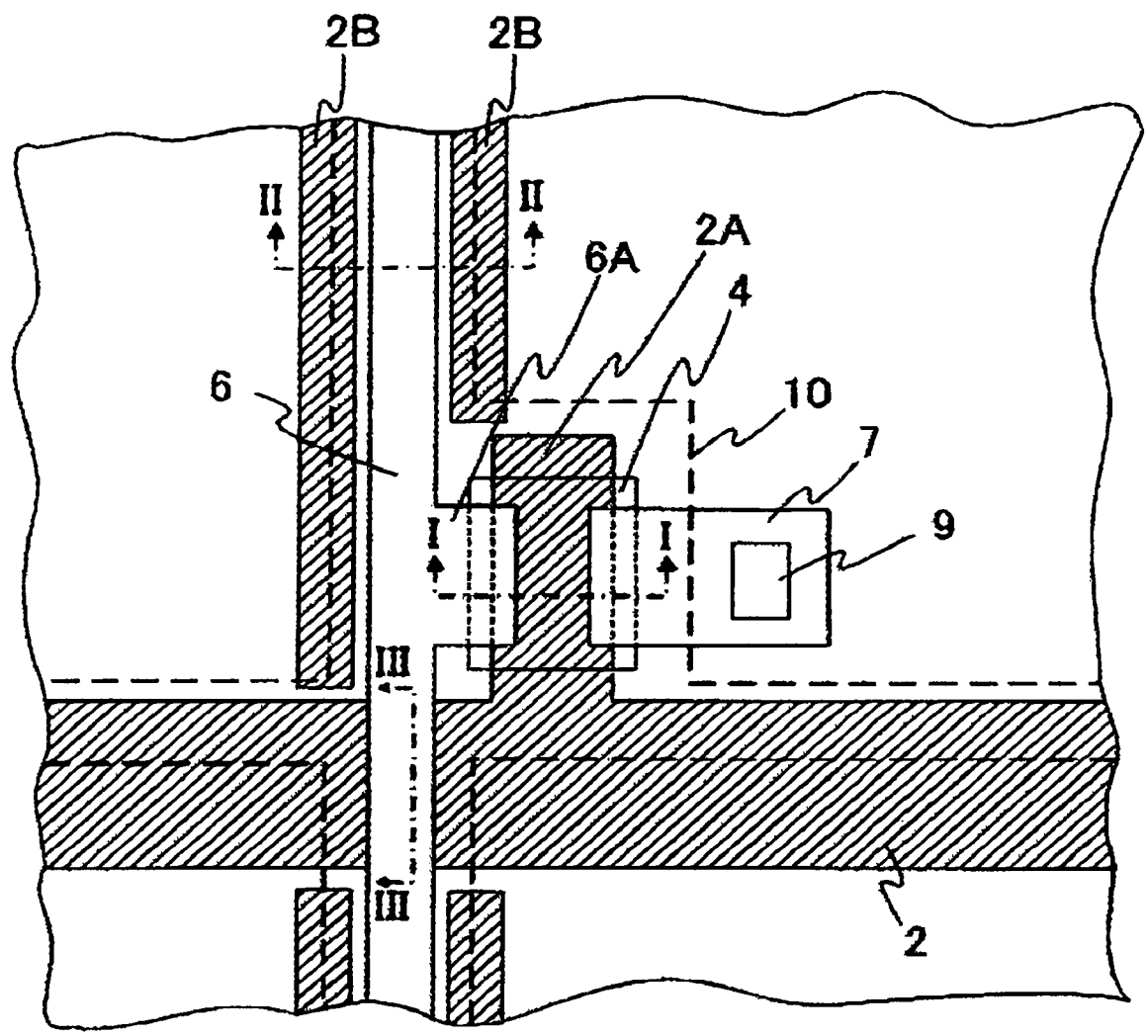
FIG. 3 is a plan view schematically showing a structure of a vicinity of an intersection between a gate wiring and a drain wiring of a TFT substrate according to a LCD device of the present invention.

A gate light-shielding film 2B is formed in the same layer as the gate wiring 2 and in between the drain wiring 6 and the pixel electrode 10 as shown in FIG. 3. The gate light-shielding film 2B shields light shining through the periphery of the pixel electrode 10. The source electrode 7 is connected to the pixel electrode 10 via a contact hole 9 on the TFT substrate in FIG. 3.

The gate light-shielding film 2B is formed in the groove 12 formed on the surface of the insulating substrate 1 as shown in FIG. 4B. The gate light-shielding film 2B is formed of a structure where the Cu layer 14 is surrounded by the lower layer barrier metal film 13 and the upper layer barrier metal film 15 as in the gate electrode 2A.

As described so far, in the LCD device of the present invention, since the lower layer wirings like the gate wiring 2 are buried in the groove 12 formed at the surface of the insulating substrate 1, a surface of the gate insulating film 3 becomes smooth on the TFT substrate. As a result, the disconnection failures of the upper layer wirings originating from the difference in level of the lower layer wirings and the disclination defects can be avoided. Moreover, the lower layer wirings have a groove wiring structure and are made of the Cu layer surrounded by the barrier metal film. Since the thickness of the lower layer wirings can be made thick when the depth of the groove increases, decreasing the resistance of the lower layer wirings becomes easier and it becomes possible to suppress the signal delays in the lower layer-wirings. In addition, it is possible to improve resistances to chemicals and corrosion as well as adhesion of the lower layer wirings made of Cu by surrounding them using the barrier metal film in the TFT substrate of the present invention.

A first example of the manufacturing method for the LCD device of the present invention is next described by referring to FIGS. 5A to 5F. Note that a case where the present invention is applied to a TFT substrate with an inverted staggered structure will be described below.

Figure 5A:
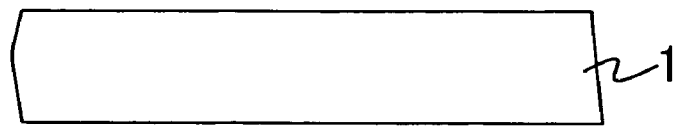
FIGS. 5A to 5F show steps of a manufacturing method of a LCD device according to a first example of the present invention.
Figure 5B:
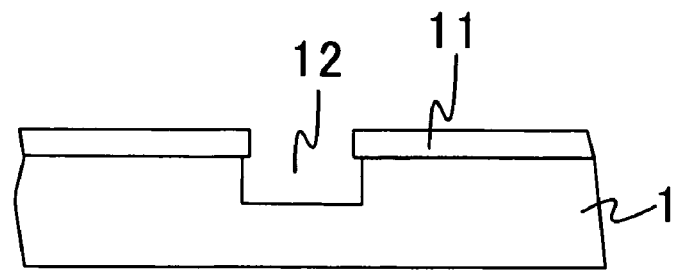

Firstly, the groove 12 for embedding the gate electrode and the gate wiring on the insulating substrate 1 made of the glass substrate or the plastic substrate using known techniques of photolithography and etching as shown in FIGS. 5A to 5B. Specifically, a resist 11 is applied on the insulating substrate (in the case of a glass substrate) and patterned. The glass substrate is then etched by buffered hydrofluoric acid to form the groove 12 with a depth of approximately 300 nm to 500 nm.

Figure 5C:
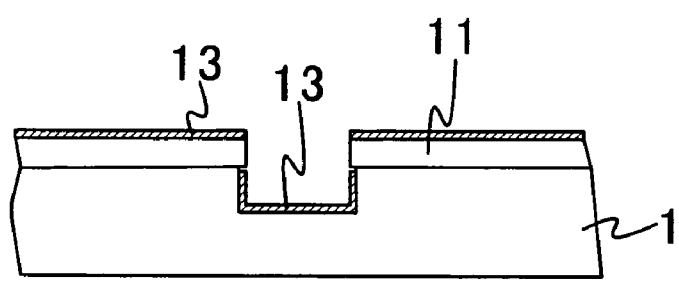

Subsequently, the lower layer barrier metal film 13 is formed in the groove 12 by a lift-off technique as shown in FIG. 5C. Specifically, before removing the resist 11, the lower layer barrier metal film 13 is subjected to sputtering after etching the glass substrate with buffered hydrofluoric acid. It is possible to form a metal film 13 on the side wall of the groove 12 at the time of this sputtering since the sputtered metal also goes round to a side etched part of the insulating substrate 1 under the resist 11. The resist 11 is thereafter removed and the lower layer barrier metal film 13 on the resist is also removed. This lower layer barrier film 13 is formed with a thickness of approximately 50 nm to 100 nm and the high-melting-point metals such as Cr, Mo and Ti can be used.

Figure 5D:
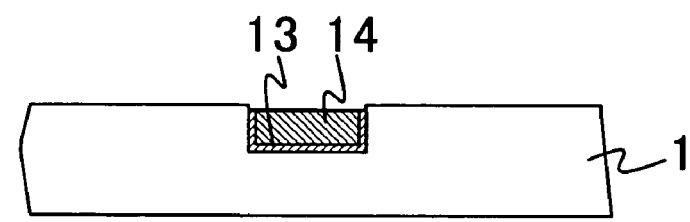

As Next, as shown in FIG. 5D, the Cu layer 14 is formed on the lower layer barrier metal film 13. Specifically, the Cu layer 14 is formed only on the lower layer barrier metal film 13 using an electroless plating method. The thickness of this Cu layer 14 is made into a film thickness (approximately 200 nm to 300 nm) so that it does not to protrude from the surface of the insulating substrate 1. Note that as long as Cu is the major component, other materials can be contained in the Cu layer 14.

Figure 5E:
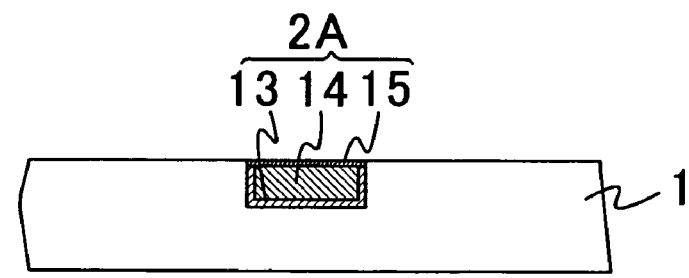

As shown in FIG. 5E, an upper layer barrier metal film 15 is then formed on a gate pattern. In this way, the formation of the gate electrode 2A and the gate wiring (not shown) embedded in the insulating substrate 1 is completed. Although this upper layer barrier metal film 15 can be formed using the electroless plating method, it is also formable using the photolithography technique following the sputtering. This upper layer barrier film 15 is formed with a thickness of approximately 50 nm to 100 nm and the high-melting-point metals such as Cr, Mo and Ti can be used. Moreover, the gate light-shielding film is simultaneously formed in a part between an area where the drain wiring is formed and an area where the pixel electrode is formed at the time of forming the above described gate electrode 2A or the like. The gate light-shielding film also has the same groove wiring structure as that of the gate electrode 2A or the like. The gate light-shielding film shields the leaking light from the periphery of the pixel electrode.

A gate insulating film 5 with a thickness of approximately 300 nm to 500 nm is then formed all over by forming the SiN film for example, using the plasma CVD method. An a-Si film 4 with a thickness of approximately 200 nm is formed followed by the formation of the n+ a-Si film 5 thereon with a thickness of approximately 5 nm as an ohmic layer containing phosphorus, respectively using the plasma CVD method. The n+ a-Si film 5 and a-Si film 4 are then subsequently dry etched using a resist (not shown) formed into required patterns as masks to form the island-shaped semiconductor layer. Note that this semiconductor layer can also be formed using polycrystalline silicon.

Subsequently, approximately 200 nm of a metal layer of Mo or the like is deposited by the sputtering method. The Mo metal layer is then etched using a resist formed into a required pattern (not shown) as a mask and the patterns for the source electrode 7, the drain electrode 6A and the drain wiring 6 (not shown) are formed.

Next, the n+ a-Si film 5 is then dry etched using the source electrode 7 and drain electrode 6A as masks. The n+ a-Si film 5 between the source electrode 7 of the island-shaped semiconductor layer and the drain electrode 6A is etched by this etching process and a channel gap and a TFT element are formed.

Subsequently, approximately 150 nm to 200 nm of a film made of SiN, for example, is formed by the plasma CVD method to form a passivation film 8. The passivation film 8 on the source electrode 7 is partially etched using a resist (not shown) formed into a required pattern as a mask to form a contact hole 9 (not shown).

Figure 5F:
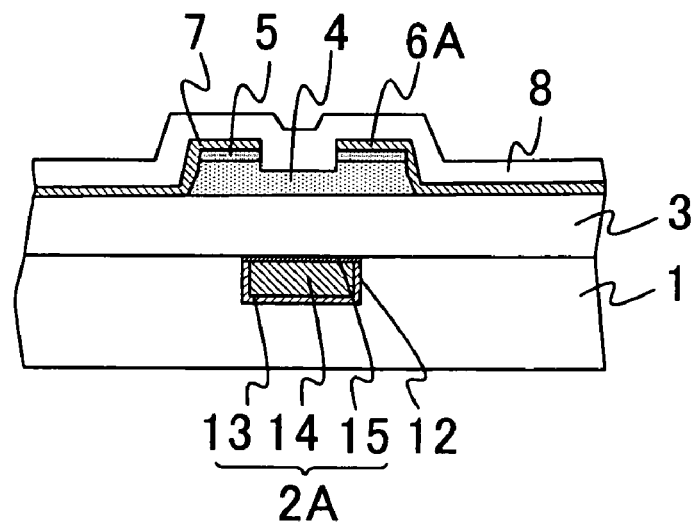

Approximately 50 nm of a transparent conductive film like the ITO film, for example, is then formed allover by the sputtering method. The TFT substrate is then completed by etching the above described transparent conductive film using the resist formed into a required pattern as a mask and forming the pixel electrode 10 (not shown). FIG. 5F shows a cross-sectional view of a TFT portion on the completed TFT substrate.

Subsequently, an opposite substrate (not shown) as a second substrate is placed opposite to this TFT substrate. An LCD device is then completed by inserting a liquid crystal layer in between these substrates. Note that liquid crystal alignment film is formed on surfaces of both substrates before inserting the liquid crystal layer.

Figure 6:
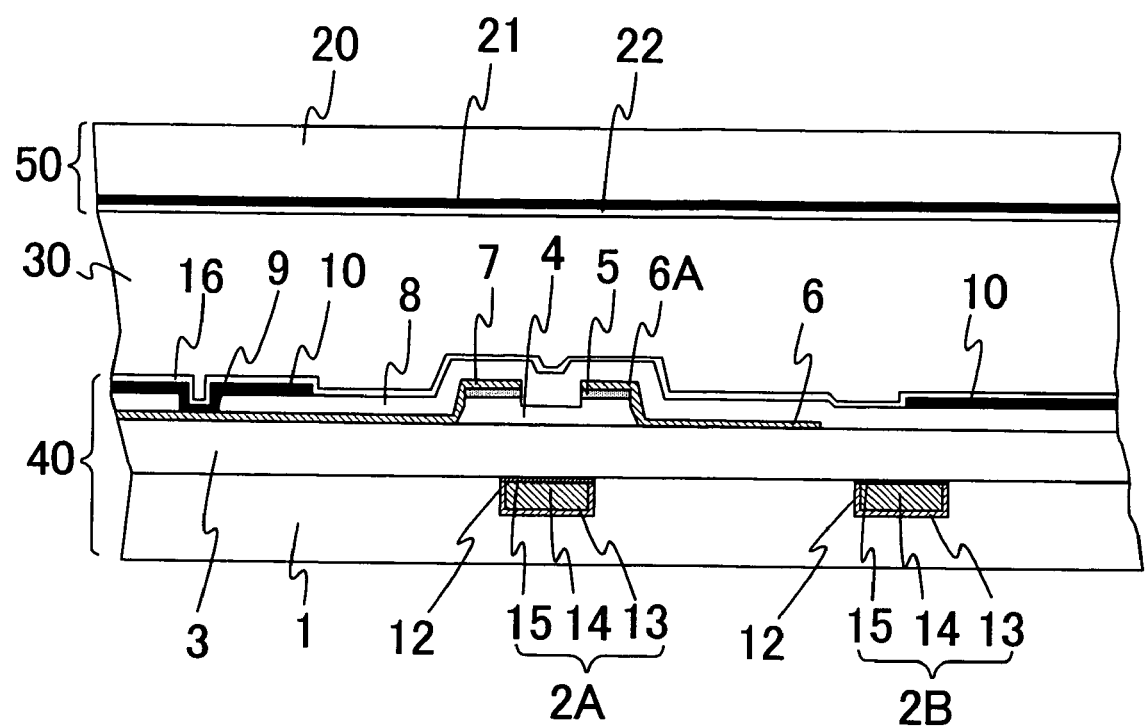
FIG. 6 is a cross-sectional view showing one example of the LCD device of the present invention.

A cross-sectional view of the completed LCD device is shown in FIG. 6. Reference numerals 40 and 50 in FIG. 6 show the TFT substrate and the opposite substrate, respectively. Moreover, a reference numeral 30 shows the liquid crystal layer inserted between the TFT substrate 40 and the opposite substrate 50. The groove 12 is formed on the surface of the insulating substrate 1 of the TFT substrate 40. A gate electrode 2A is formed in the groove 12. A surface of the gate electrode 2A is not protruded to the surface of the insulating substrate 1 and is smooth.

A drain wiring 6 is integrally formed with a drain electrode 6A. A gate light-shielding film 2B is formed between the drain wiring 6 and the pixel electrode 10 and in the same layer as the gate electrode 2A. The gate light-shielding film 2B is formed in the groove 12 formed on the surface of the insulating substrate 1 as in the gate electrode 2A. The source electrode 7 is connected to the pixel electrode 10 via the contact hole 9.

The opposite substrate 50 is configured by the formation of an insulating substrate 20 made of a glass substrate or the like and an opposite electrode 21 made of a transparent conductive film like the ITO film and so forth on a surface opposing the TFT substrate 40.

Liquid crystal alignment films 16 and 22, made from polyimide resins or the like are respectively formed on surfaces of the TFT substrate 40 and the opposite substrate 50.

A second example of the manufacturing method for the LCD device of the present invention is next described by referring to FIGS. 7A to 7F.

Figure 7A:
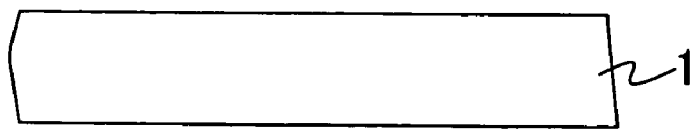
FIGS. 7A to 7F show steps of a manufacturing method of a LCD device according to a second example of the present invention.
Figure 7B:
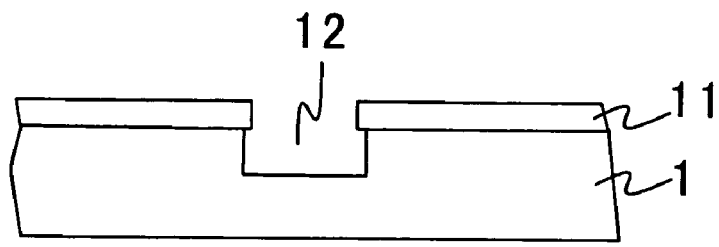

Firstly, the groove 12 for embedding the gate electrode and the gate wiring on the insulating substrate 1 made of the glass substrate or the plastic substrate is formed using known techniques of photolithography and etching as shown in FIGS. 7A to 7B. Specifically, the resist 11 is applied to the insulating substrate 1 (in the case of the glass plate) and patterned. The glass substrate is then etched by buffered hydrofluoric acid to form the groove 12 with a depth of approximately 300 nm to 500 nm.

Figure 7C:
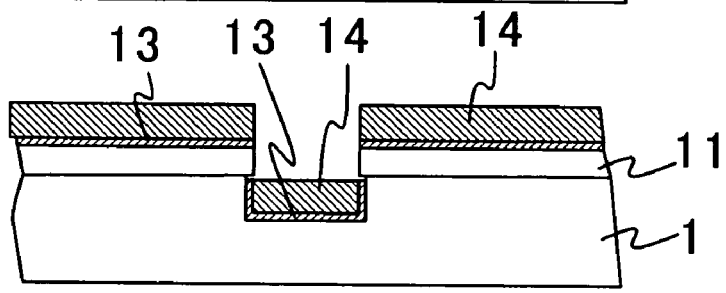
Figure 7D:
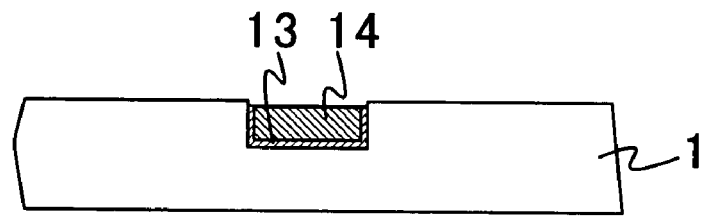

Subsequently, two layers including the lower layer barrier metal film 13 and the Cu layer 14 are sequentially formed in the groove 12 by the lift-off technique as shown in FIGS. 7C to 7D. Specifically, the lower layer barrier metal film 13 is subjected to sputtering after etching the glass substrate with buffered hydrofluoric acid. The Cu layer 14 is then formed by successive sputtering. The resist 11 is thereafter removed and the lower layer barrier metal film 13 and the Cu layer 14 on the resist are removed apart from the groove 12. The sputtered metal goes round to the side etched part of the insulating substrate 1 under the resist 11 to form a film at the time of this sputtering. It is also possible to form the lower layer barrier metal film 13 on the side wall of the groove 12. This lower layer barrier metal film 13 is formed with a thickness of approximately 50 nm to 100 nm and the high-melting-point metals such as Cr, Mo and Ti can be used. The thickness of the Cu layer 14 is made into a film thickness (approximately 200 nm to 300 nm) so that it does not protrude from the surface of the insulating substrate 1. Note that as long as Cu is the major component, other materials can be contained in the Cu layer 14.

Figure 7E:
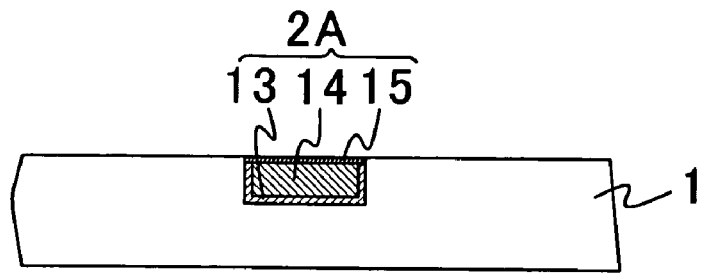

As shown in FIG. 7E, an upper layer barrier metal film 15 is then formed on the gate pattern and complete the gate electrode 2A and the gate wiring 2 (not shown) embedded in the insulating substrate 1. Although this upper layer barrier metal film 15 can be formed using the electroless plating method, it is also formable using the photolithography technique following the sputtering. This upper layer barrier film 15 is formed with a thickness of approximately 50 nm to 100 nm and the high-melting-point metals such as Cr, Mo and Ti can be used for its formation. Moreover, the gate light-shielding film 2B (not shown) is simultaneously formed in a part between an area where the drain wiring is formed and an area where the pixel electrode is formed at the time of forming the above described gate electrode 2A or the like. The gate light-shielding film 2B shields the leaking light from the periphery of the pixel electrode. The gate light-shielding film 2B has the same groove wiring structure as that of the gate electrode 2A or the like.

Subsequently, the source electrode 7, the drain electrode 6A, the drain wirings and the like are formed after the formation of an island-shaped semiconductor layer via the gate insulating film 3 as described in the first example described above. The passivation film 8 is then formed by forming a approximately 150 nm to 200 nm of, for example, the SiN film allover by the plasma CVD method. The contact hole 9 (not shown) is then formed by partially etching the passivation film 8 on the source electrode 7 using the resist (not shown) formed into a required pattern as a mask.

Figure 7F:
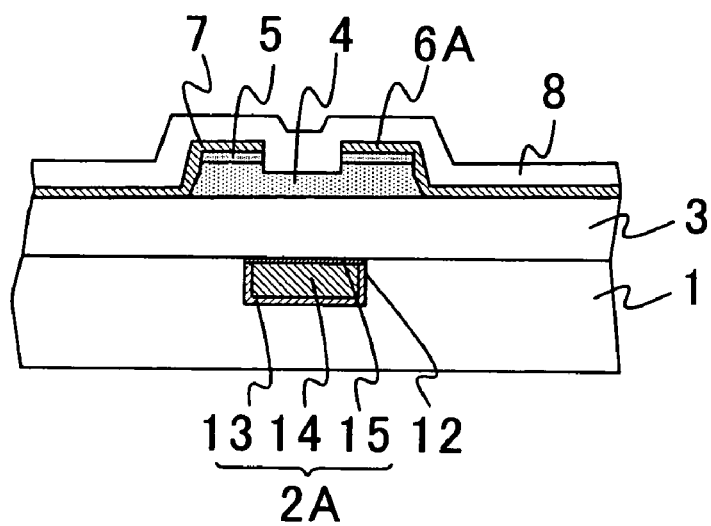

Approximately 50 nm of a transparent conductive film made of, for example, the ITO film or the like is formed allover by the sputtering method. The TFT substrate is then completed by etching the above described transparent conductive film using the resist formed into a required pattern as a mask and forming the pixel electrode 10 (not shown). FIG. 7F shows a cross-sectional view of the TFT portion on the completed TFT substrate.

The opposite substrate (not shown) is then placed opposite to this TFT substrate. The LCD device with a similar structure to that shown in FIG. 6 is completed by inserting the liquid crystal layer between both substrates.

It should be noted that although manufacturing method of the LCD device having a channel etch type thin film transistor with an inverted staggered structure (bottom gate structure) on the TFT substrate is described in each of the above described examples, the present invention is not limited to the above described embodiments. For example, the present invention only needs to have the above described structure in the wiring in the lower layer side and can be applied to the TFT substrates of a channel protection type or ones with a TFT of a staggered structure (top gate structure) and to the TFT substrates with color filters in the TFT substrate side.

Although the LCD device of a vertical alignment type is shown as an example of the LCD device of the present invention in FIG. 6, it is needless to say that the present invention can be applied to an LCD device driven by lateral electric field.

Moreover, a wiring structure of an LCD substrate of the present invention can be applied not only to the LCD devices but also to a substrate for display device using an electroluminescence (EL) element in a similar way. While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A liquid crystal display device which includes a first plastic substrate, a second substrate placed opposite to the first substrate and a liquid crystal layer inserted therebetween comprising:
   a plurality of first wirings in a lower layer side and a plurality of second wirings in an upper layer side extending in a direction perpendicular to each other on said first substrate;
   a switching element arranged in a vicinity of an intersection between the first and second wirings; and
   a pixel electrode formed in each pixel region surrounded by the first and second wirings,
   wherein a first wiring of the plurality of first wirings is formed of a metal layer containing copper embedded in a groove formed within the first plastic substrate and a barrier metal film covering at least a part of surroundings of the metal layer, and
   wherein the barrier metal film comprises a first barrier metal film arranged on a bottom and a side wall of the groove, and a second barrier metal film arranged on a top of the groove.

2. The liquid crystal display device according to claim 1, the first substrate further comprising:
   a light-shielding film in a region including a part of an area between a second wiring of the plurality of second wirings arid the pixel electrode,
   wherein the light-shielding film is formed in the same layer as the first wiring and has the same groove wiring structure as that of the first wiring.

3. The liquid crystal display device according to claim 1, wherein the switching element comprises a thin film transistor.

4. The liquid crystal display device according to claim 1, wherein the first and second barrier metal films comprises molybdenum (Mo).

5. The liquid crystal display device according to claim 1, wherein the groove has a depth between about 300 nm and about 500 nm.

6. The liquid crystal display device according to claim 1, wherein the first barrier metal film and the second barrier metal film have a thickness between about 50 nm and about 100 nm.

7. The liquid crystal display device according to claim 1, wherein the metal layer has a thickness between about 200 nm and about 300 nm.

8. The liquid crystal display device according to claim 1, wherein the metal layer is formed by an electroless plating method.

9. A method of manufacturing a liquid crystal display device comprising:
   forming a first wiring in a lower layer side on a first, plastic substrate;
   forming a second wiring in an upper layer side extending in a direction perpendicular to said first wiring;
   forming a switching element in a vicinity of an intersection between the first and second wirings;
   forming a pixel electrode in each pixel region surrounded by the first and second wirings;
   placing a second substrate opposite to the first substrate;
   inserting a liquid crystal layer between the first and second substrates;
   forming a groove in a region forming the first wiring within the first plastic substrate;
   forming a first barrier metal film on a bottom and a side wall of the groove;
   forming a metal layer containing copper layer in a region surrounded by the first barrier metal film; and
   forming a second barrier metal film on a top of the groove.

10. The method of manufacturing the liquid crystal display device according to claim 9, wherein the first barrier metal film and the metal layer are formed successively.

11. The method of manufacturing the liquid crystal display device according to claim 9, further comprising:
   forming a groove in a region between an area forming the second wiring and an area forming the pixel electrode,
   forming a light-shielding film in the groove.

12. The method of manufacturing the liquid crystal display device according to claim 9, wherein the first and second barrier metal films comprises molybdenum (Mo).

13. The method of manufacturing the liquid crystal display device according to claim 9, wherein the groove has a depth between about 300 nm and about 500 nm.

14. The method of manufacturing the liquid crystal display device according to claim 9, wherein the groove is formed by using buffered hydrofluoric acid.

15. The method of manufacturing the liquid crystal display device according to claim 9, wherein the first barrier metal film and the second barrier metal film have a thickness between about 50 nm and about 100 nm.

16. The method of manufacturing the liquid crystal display device according to claim 9, wherein the metal layer has a thickness between about 200 nm and about 300 nm.

17. The method of manufacturing the liquid crystal display device according to claim 9, wherein the metal layer is formed by an electroless plating method.

* * * * *